(12) United States Patent
Mernyk et al.

(10) Patent No.: US 7,535,234 B2
(45) Date of Patent: May 19, 2009

(54) ARC FAULT DETECTOR

(75) Inventors: Ross Mernyk, Brooklyn, NY (US);
Roger M. Bradley, North Bellmore, NY (US)

(73) Assignee: Leviton Manufacturing Co., Inc., Little Neck, NY (US)

( * ) Notice: Subject to any disclaimer, the term of this patent is extended or adjusted under 35 U.S.C. 154(b) by 0 days.

(21) Appl. No.: 11/738,783

(22) Filed: Apr. 23, 2007

(65) Prior Publication Data
US 2007/0262780 A1    Nov. 15, 2007

Related U.S. Application Data

(63) Continuation of application No. 11/295,277, filed on Dec. 5, 2005, now Pat. No. 7,259,568, which is a continuation of application No. 10/743,248, filed on Dec. 22, 2003, now Pat. No. 6,972,572.

(51) Int. Cl.
G01R 31/02    (2006.01)

(52) U.S. Cl. .......................................... 324/536; 361/42

(58) Field of Classification Search ................ 324/536; 361/42
See application file for complete search history.

(56) References Cited

U.S. PATENT DOCUMENTS

| | | |
|---|---|---|
| 3,904,859 A | 9/1975 | Poncelet |
| 4,356,443 A | 10/1982 | Emery |
| 4,376,243 A | 3/1983 | Renn et al. |
| 4,466,071 A | 8/1984 | Russell, Jr. |
| 4,618,907 A | 10/1986 | Leopold |
| 4,658,322 A | 4/1987 | Rivera |
| 4,709,293 A | 11/1987 | Gershen et al. |
| 4,851,782 A | 7/1989 | Jeerings et al. |
| 4,878,144 A | 10/1989 | Nebon |
| 4,931,894 A | 6/1990 | Legatti |
| 4,933,630 A | 6/1990 | Dupraz |
| 4,939,495 A | 7/1990 | Peterson et al. |
| 5,121,282 A | 6/1992 | White |
| 5,185,684 A | 2/1993 | Beihoff et al. |
| 5,185,686 A | 2/1993 | Hansen et al. |

(Continued)

FOREIGN PATENT DOCUMENTS

WO    WO2005062917    7/2005

OTHER PUBLICATIONS

Underwriters Laboratories Inc.—Technology for Detecting and Monitoring Conditions That Could Cause Electrical Wiring System Fires—Contract No. CPSC-C-94-1112 Sep. 1995—192 pages.

Primary Examiner—Vincent Q Nguyen
(74) Attorney, Agent, or Firm—Collard & Roe, P.C.

(57)    ABSTRACT

An arc fault detector, as a stand alone device or in combination with a circuit interrupting device such as a ground fault interrupter (GFCI), protects from potentially dangerous arc fault conditions. The device utilizes a line side or load side series connected inductance having an air or magnetic core to generate the derivative di/dt signal of the arc current in the conductor. The derivative signal is fed to an arc fault detector where it is analyzed for the presence of arcing. The device can have two series connected inductors inductively coupled to each other such that the signal from one inductor is inductively coupled into the other inductor for coupling to the arc fault detector.

48 Claims, 6 Drawing Sheets

U.S. PATENT DOCUMENTS

| | | |
|---|---|---|
| 5,202,662 A | 4/1993 | Bienwald et al. |
| 5,206,596 A | 4/1993 | Beihoff et al. |
| 5,223,795 A | 6/1993 | Blades |
| 5,224,006 A | 6/1993 | MacKenzie et al. |
| 5,280,404 A | 1/1994 | Ragsdale |
| 5,383,799 A | 1/1995 | Fladung |
| 5,432,455 A | 7/1995 | Blades |
| 5,434,509 A | 7/1995 | Blades |
| 5,459,630 A | 10/1995 | MacKenzie et al. |
| 5,519,561 A | 5/1996 | Mrenna et al. |
| 5,536,980 A | 7/1996 | Kawate et al. |
| 5,561,505 A | 10/1996 | Lewis |
| 5,561,605 A | 10/1996 | Zuercher et al. |
| 5,590,012 A | 12/1996 | Dollar, II |
| 5,600,524 A | 2/1997 | Neiger et al. |
| 5,682,101 A | 10/1997 | Brooks et al. |
| 5,689,180 A | 11/1997 | Carlson |
| 5,715,125 A | 2/1998 | Neiger et al. |
| 5,729,145 A | 3/1998 | Blades |
| 5,805,397 A | 9/1998 | MacKenzie |
| 5,805,398 A | 9/1998 | Rae |
| 5,815,352 A | 9/1998 | Mackenzie |
| 5,818,237 A | 10/1998 | Zuercher et al. |
| 5,818,671 A | 10/1998 | Seymour et al. |
| 5,825,598 A | 10/1998 | Dickens et al. |
| 5,834,940 A | 11/1998 | Brooks et al. |
| 5,835,321 A | 11/1998 | Elms et al. |
| 5,839,092 A | 11/1998 | Erger et al. |
| 5,847,913 A | 12/1998 | Turner et al. |
| 5,886,606 A | 3/1999 | Tosaka et al. |
| 5,906,517 A | 5/1999 | Crane et al. |
| 5,940,256 A | 8/1999 | MacKenzie et al. |
| 5,946,179 A | 8/1999 | Fleege et al. |
| 5,963,406 A | 10/1999 | Neiger et al. |
| 5,986,860 A | 11/1999 | Scott |
| 5,999,384 A | 12/1999 | Chen et al. |
| 6,088,205 A | 7/2000 | Neiger et al. |
| 6,128,169 A | 10/2000 | Neiger et al. |
| 6,191,589 B1 | 2/2001 | Clunn |
| 6,218,844 B1 | 4/2001 | Wong et al. |
| 6,246,556 B1 | 6/2001 | Haun et al. |
| 6,259,996 B1 | 7/2001 | Haun et al. |
| 6,266,219 B1 | 7/2001 | Macbeth et al. |
| 6,275,044 B1 | 8/2001 | Scott |
| 6,295,190 B1 | 9/2001 | Rinaldi et al. |
| 6,313,641 B1 | 11/2001 | Brooks |
| 6,339,525 B1 | 1/2002 | Neiger et al. |
| 6,359,745 B1 | 3/2002 | Thomas, III et al. |
| 6,373,257 B1 | 4/2002 | Macbeth et al. |
| 6,381,112 B1 | 4/2002 | DiSalvo |
| 6,407,893 B1 | 6/2002 | Neiger et al. |
| 6,417,671 B1 | 7/2002 | Tiemann |
| 6,421,214 B1 | 7/2002 | Packard et al. |
| 6,426,632 B1 | 7/2002 | Clunn |
| 6,426,634 B1 | 7/2002 | Clunn et al. |
| 6,433,977 B1 | 8/2002 | Macbeth |
| 6,433,978 B1 | 8/2002 | Neiger et al. |
| 6,538,862 B1 | 3/2003 | Mason, Jr. et al. |
| 6,538,863 B1 | 3/2003 | Macbeth |
| 6,545,574 B1 | 4/2003 | Seymour et al. |
| 6,567,250 B1 | 5/2003 | Haun et al. |
| 6,570,392 B2 | 5/2003 | Macbeth et al. |
| 6,577,484 B1 | 6/2003 | Macbeth et al. |
| 6,628,486 B1 | 9/2003 | Macbeth |
| 6,639,769 B2 | 10/2003 | Neiger et al. |
| 6,642,832 B2 | 11/2003 | Pellon et al. |
| 6,720,872 B1 | 4/2004 | Engel et al. |
| 6,731,483 B2 | 5/2004 | Mason, Jr. et al. |
| 6,782,329 B2 | 8/2004 | Scott |
| 6,785,104 B2 | 8/2004 | Tallman et al. |
| 6,807,035 B1 | 10/2004 | Baldwin et al. |
| 6,807,036 B2 | 10/2004 | Baldwin |
| 6,810,069 B2 | 10/2004 | Kojovic et al. |
| 6,876,528 B2 | 4/2005 | Macbeth |
| 6,937,027 B2 | 8/2005 | Koo et al. |
| 6,943,558 B2 | 9/2005 | Hale et al. |
| 6,972,572 B2 | 12/2005 | Mernyk et al. |
| 7,003,435 B2 | 2/2006 | Kolker et al. |
| 7,009,406 B2 | 3/2006 | Naidu et al. |
| 7,035,066 B2 | 4/2006 | McMahon et al. |
| 7,064,944 B2 | 6/2006 | Kim et al. |
| 7,068,481 B2 | 6/2006 | Radosavljevic |
| 7,149,065 B2 | 12/2006 | Baldwin et al. |
| 7,180,299 B2 | 2/2007 | Mernyk et al. |
| 7,180,717 B2 | 2/2007 | Kojovic et al. |
| 7,190,562 B2 | 3/2007 | Pellon et al. |
| 7,215,520 B2 | 5/2007 | Elms et al. |
| 7,227,441 B2 | 6/2007 | Skendzic et al. |
| 7,253,603 B2 | 8/2007 | Kovanko et al. |
| 7,253,637 B2 | 8/2007 | Dvorak et al. |
| 7,259,568 B2 | 8/2007 | Mernyk et al. |
| 7,268,989 B2 | 9/2007 | Parker et al. |
| 7,304,820 B2 | 12/2007 | Kato et al. |
| 7,309,993 B2 | 12/2007 | Driehorn et al. |
| 7,319,574 B2 | 1/2008 | Engel |
| 7,321,227 B2 | 1/2008 | Fritsch et al. |
| 7,333,920 B2 | 2/2008 | Kolker et al. |
| 7,403,129 B2 | 7/2008 | Zhou et al. |
| 7,405,569 B2 | 7/2008 | Hagel et al. |
| 7,443,644 B2 | 10/2008 | Sung |
| 2003/0072113 A1 | 4/2003 | Wong et al. |
| 2005/0063535 A1 | 3/2005 | Walbeck et al. |
| 2005/0191902 A1 | 9/2005 | Kim et al. |
| 2005/0286184 A1 | 12/2005 | Campolo |
| 2006/0171085 A1 | 8/2006 | Keating |
| 2007/0262780 A1 | 11/2007 | Mernyk et al. |

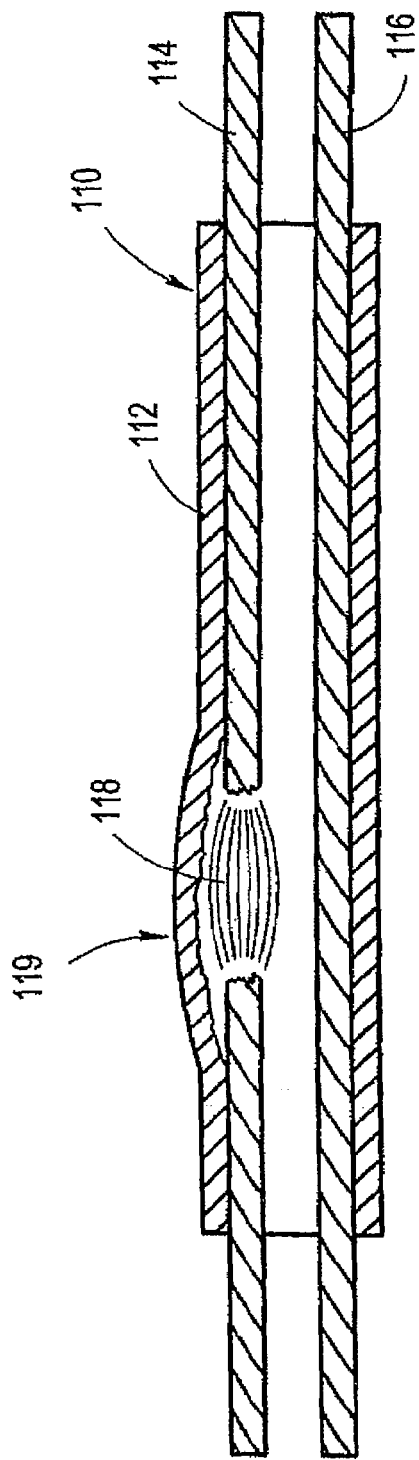
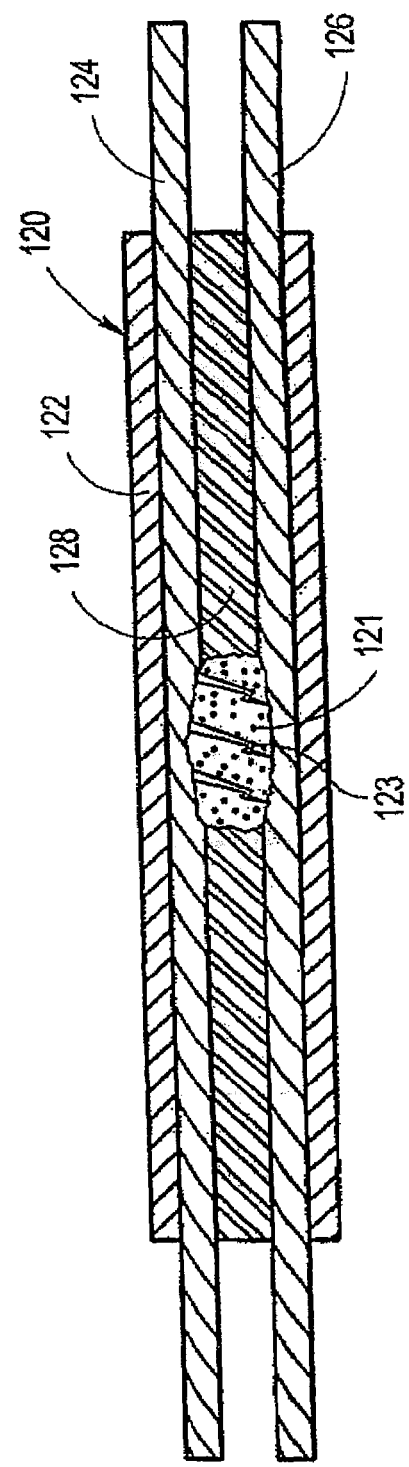

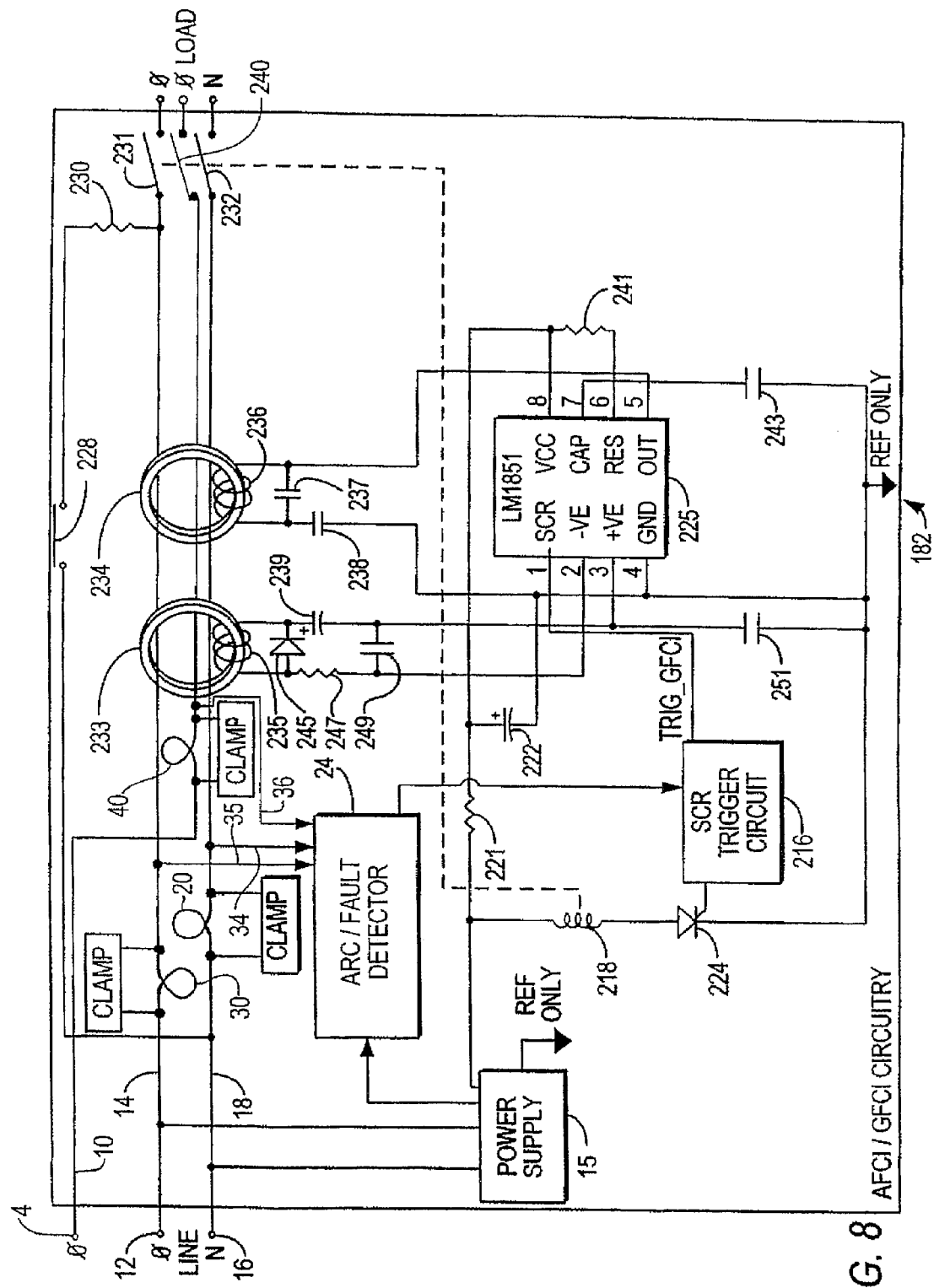
FIG. 8 AFCI / GFCI CIRCUITRY

ARC FAULT DETECTOR

CROSS REFERENCE TO RELATED APPLICATIONS

This application is a continuation of application Ser. No. 11/295,277 filed on Dec. 5, 2005, now U.S. Pat. No. 7,259,568, which is a continuation of application Ser. No. 10/743,248 filed on Dec. 22, 2003 now U.S. Pat. No. 6,972,572.

FIELD OF THE INVENTION

The present invention relates to an apparatus and method for arc fault detection and more particularly relates to an apparatus and method for both a stand alone arc fault detector and an arc fault detector combined with a circuit interrupter device.

BACKGROUND OF THE INVENTION

Circuit breakers, fuses and ground fault circuit interrupters (GFCIs) are commonly used devices for protecting people and property from dangerous electrical faults. Fatalities and loss of property caused by electrical faults that go undetected by these protective devices still occur. One such type of electrical fault that typically goes undetected are arc faults. Arcs are potentially dangerous due to the high temperatures contained within them. Thus, they have a high potential of creating damage, mostly through the initiation of fires. An arc, however, will trip a GFCI only if it produces sufficient current leakage to ground. In addition, an arc will trip a breaker only if the current flowing through the arc exceeds the trip parameters of the thermal/magnetic mechanism of the breaker. Therefore, an additional type of protection device is needed to detect and interrupt arcs. An arc detector whose output is used to trigger a circuit interrupting mechanism is referred to as an Arc Fault Circuit Interrupter (AFCI).

The causes of arcing are numerous, for example: aged or worn insulation and wiring; mechanical and electrical stress caused by overuse, over currents or lightning strikes; loose connections; and mechanical damage to insulation and wires. Two types of arcing can occur in residential and commercial buildings: contact arcing and line arcing. Contact or series arcing occurs between two contacts in series with a load. Therefore, the load controls the current flowing in the arc. Line or parallel arcing occurs between the conductors of a circuit or from a conductor to ground. In this case the arc is in parallel with any load present and the source impedance provides the only limit to the current flowing in the arc.

An example of contact arcing is illustrated in FIG. 1. The conductors 114, 116 comprising the cable 110, are separated and surrounded by an insulator 112. A portion of the conductor 114 is broken, creating a series gap 118 in conductor 114. Under certain conditions, arcing will occur across this gap, producing a large amount of localized heat. The heat generated by the arcing might be sufficient to break down and carbonize the insulation close to the arc 119. If the arc is allowed to continue, enough heat will be generated to start a fire.

A schematic diagram illustrating an example of line arcing is shown in FIG. 2. Cable 120 comprises electrical conductors 124, 126 covered by outer insulation 122 and separated by inner insulation 128. Deterioration or damage to the inner insulation at 121 may cause line fault arcing 123 to occur between the two conductors 124, 126. The inner insulation could have been carbonized by an earlier lightning strike to the wiring system, or it could have been cut by mechanical action such as a metal chair leg cutting into an extension cord.

The potentially devastating results of arcing are widely known and a number of methods of detecting arcs have been developed in the prior art. A large percentage of the prior art refers to detecting high frequency signals generated on the AC line by arcs.

A wide range of prior art exists in the field of arc detection. Some of the prior art refer to specialized instances of arcing. For example, U.S. Pat. No. 4,376,243, issued to Renn, et al., teaches a device that operates with DC current. U.S. Pat. No. 4,658,322, issued to Rivera, teaches a device that detects arcing within an enclosed unit of electrical equipment. U.S. Pat. No. 4,878,144, issued to Nebon, teaches a device that detects the light produced by an arc between the contacts of a circuit breaker.

In addition, there are several patents that refer to detecting arcs on AC power lines that disclose various methods of detecting high frequency arcing signals. For example, U.S. Pat. Nos. 5,185,684 and 5,206,596, both issued to Beihoff et al., employ a complex detection means that separately detects the electric field and the magnetic field produced around a wire. U.S. Pat. No. 5,590,012, issued to Dollar, teaches measuring the high frequency current in a shunted path around an inductor placed in the line, which can be the magnetic trip mechanism of a breaker. In a second detection circuit, proposed by Dollar, high frequency voltage signal is extracted from the line via a high pass filter placed in parallel with any load.

Various methods can be found in the prior art to authenticate arcing and to differentiate arcing from other sources of noise. Much of the prior art involves complicated signal processing and analysis. U.S. Pat. No. 5,280,404, issued to Ragsdale, teaches looking for series arcing by converting the arcing signals to pulses and counting the pulses.

In addition, several patents detect arcing by taking the first derivative or second derivative of the detected signal. For example, U.S. Pat. No. 5,224,006, issued to MacKenzie et al., and U.S. Pat. Nos. 5,185,684 and 5,206,596, issued to Beihoff et al, disclose such a device.

Blades uses several methods to detect arcs as disclosed in U.S. Pat. Nos. 5,223,795, 5,432,455 and 5,434,509. The Blades device is based on the fact that detected high frequency noise must include gaps at each zero crossing, i.e., half cycle, of the AC line. To differentiate arcing from other sources of noise, the Blades device measures the randomness and/or wide bandwidth characteristics of the detected high frequency signal. The device taught by U.S. Pat. No. 5,434,509 uses the fast rising edges of arc signals as a detection criterion and detects the short high frequency bursts associated with intermittent arcs.

U.S. Pat. No. 5,561,505, issued to Zuercher et al., discloses a method of detecting arcing by sensing cycle to cycle changes in the AC line current. Differences in samples taken at the same point in the AC cycle are then processed to determine whether arcing is occurring.

A characteristic of arcing on a conductor is the occurrence of high frequency signals which are different from the frequency (normally 60 cycles) of the current for which the conductor is intended to carry. Electrical arcing produced by alternating voltage will extinguish each time the voltage across the arc drops below a value sufficient to sustain the arc, and will re-ignite each time the voltage across the arc exceeds the arc's minimum ignition voltage. The ignition voltage is substantially proportional to the size of the physical gap that the arc must traverse.

The extinction voltage tends to be lower than the ignition voltage. When the arc gap is very large, the arc will be intermittent and unstable and will tend to extinguish itself and re-ignite as conditions permit. As the gap becomes smaller, the arc becomes more persistent and eventually self-sustaining. When the gap becomes much smaller, the arc tends to self-extinguish by completing the current path. When the arc conducts current, it produces high frequency signals on the electrical conductors.

A number of systems that have been developed to detect arcing in buildings do so by monitoring high frequency signals present on the conductors. One such method of detecting arcing is by an arc detector that detects the derivative of the signal on the conductor. Typically, such arc detectors employ, for example, current transformers to produce signals representative of the high frequency signals on the wiring being monitored. Current transformers both add to the manufacturing cost of the arc fault detector and, because of the size of the components, creates packaging difficulties. In addition, current transformers have a limited high frequency response and poor signal-to-noise ratio.

Accordingly, there is a need for an arc fault detector that provides improved signal to noise ratio, improve high frequency response, that is relatively economical to build and that is relatively small in size.

SUMMARY OF THE INVENTION

The arc fault detector of the present invention can operate either as a stand alone Arc Fault Circuit Interrupter (AFCI) or in combination with a Ground Fault Circuit Interrupter (GFCI) to interrupt the flow of current to a load when an arc is detected. The combination device, known as an arc fault circuit interrupter/ground fault circuit interrupter (AFCI/GFCI), can be realized by the addition of arc detection circuitry to a standard GFCI. An AFCI/GFCI device is a combination arc fault and ground fault detector, which has the ability to interrupt a circuit and thereby prevent both dangerous arcing and ground fault conditions from harming personnel or property. The term 'circuit interrupting device' is defined to mean any electrical device used to interrupt current flow to a load and includes, but is not limited to devices such as Ground Fault Circuit Interrupters (GFCIs), Immersion Detection Circuit Interrupters (IDCIs) or Appliance Leakage Circuit Interrupters (ALCIs).

In the arc detector here disclosed, an inductor connected in series with at least the phase or neutral conductor monitors the current in the at least one conductor to detect arcing such as line-to-line, line-to ground, line-to-neutral or contact arcing. The signal from the inductor is the derivative(di/dt) of the current monitored and is fed to arc detection circuitry which comprises a peak detector with decay, a microcontroller with edge timing logic and a circuit interrupter. The series inductor can vary from a wire having a partial loop or bend to six or more full loops and a core that is either of air or a magnetic material for generating the derivative signal, the di/dt signal, of the current flowing through the conductor.

The present invention is capable of detecting arc faults on the line and/or load sides of the device. Once processed, the peak amplitudes of the sensed di/dt signals are directed to a microcontroller which analyzes the signal for the presence of arcing characteristics. Upon identifying a signal which indicates that arcing is present in a conductor, a trip signal is generated and fed to an interrupting mechanism which interrupts the flow of electricity to the load.

The circuit for the microcontroller can be placed on its own chip or on the chip typically used in today's GFCI. When a single chip is used for arc detection and ground fault protection, it can be powered from the same power supply that is used to provide power to the GFCI and, in addition other components of the GFCI such as the mechanism for interrupting the flow of current to the load when a fault occurs. This combined approach results in reduced manufacturing costs as mechanical parts of the GFCI device such as the trip relay and the mechanical contact closure mechanisms now serve dual purposes. In addition, adding the arc detection circuitry to an existing GFCI is a logical enhancement of present day GFCIs.

BRIEF DESCRIPTION OF THE DRAWINGS

Other aspects, features, and advantages of the present invention will become more fully apparent from the following detailed description, the appended claim, and the accompanying drawings in which similar elements have similar reference numerals.

FIG. 1 is a mechanical diagram illustrating an example of contact arcing in a current carrying conductor;

FIG. 2 is a mechanical diagram illustrating an example of line arcing between two current carrying conductors;

FIG. 8 is a circuit diagram of the second embodiment arc detection circuit in combination with a ground fault detector.

DESCRIPTION OF THE PREFERRED EMBODIMENT

Figure 3:
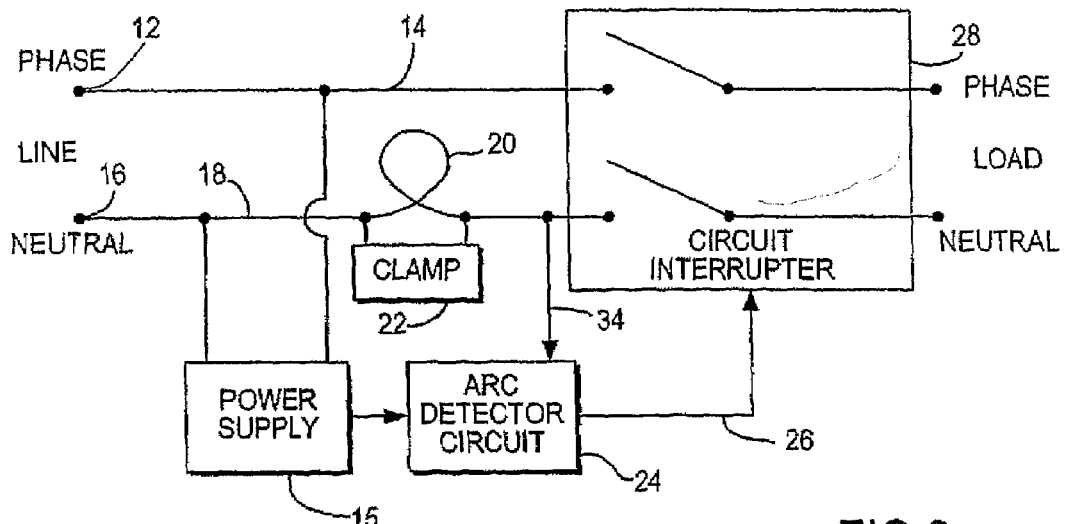
FIG. 3 is a block diagram of an arc detection system in accordance with the principles of the invention.
Figure 4:
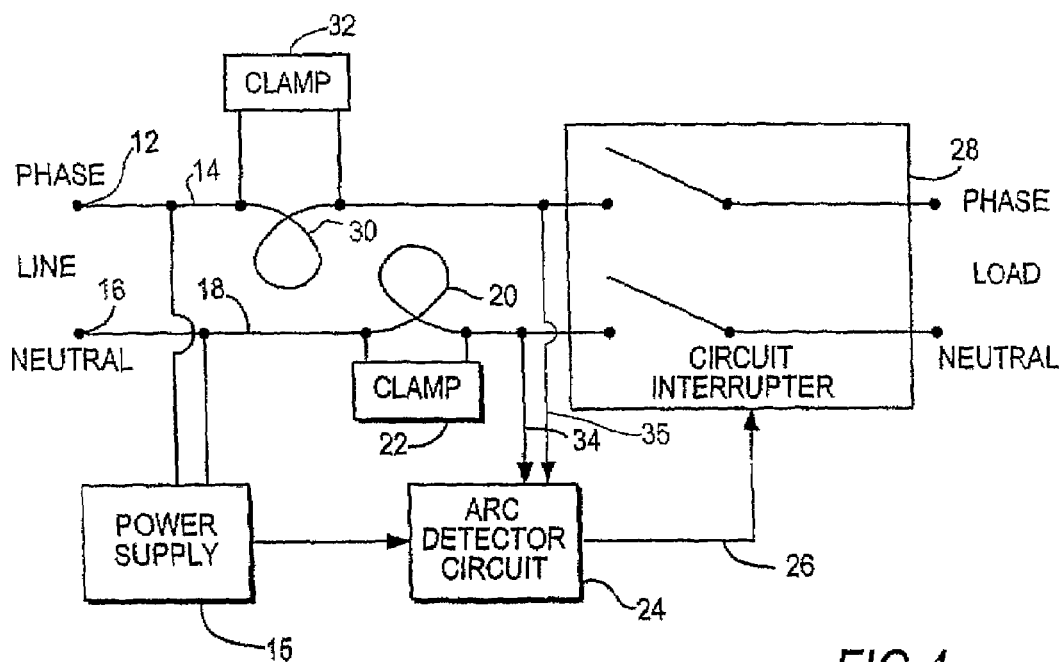
FIG. 4 is a block diagram of another embodiment of an arc detection system in accordance with the principles of the invention.

Referring to FIG. 4, there is disclosed an arc detection circuit configured to detect arcing such as neutral-to-ground, line-to-ground, line-to-neutral and/or contact arcing. Arc detection is based upon using a series inductor to monitor the current for the occurrence of arcs in at least one of the conductors of an alternating current electrical circuit such as shown in FIGS. 3 and 4. The circuit for monitoring arcs includes a source of current (not shown) coupled to terminals 12 and 16. An inductor 20, normally of the same gauge wire as the conductor 18 is coupled in series with conductor 18. The inductance of series connected inductor 20 can be formed from a wire having as little inductance as would occur from a bend of 15 degrees, to as much inductance as would occur from six or more turns of 360 degrees each, and having an air or magnetic core. The inductance of series connected inductor 20 is dependent, in part, on the magnitude of the potential required to operate the arc detector circuit 24. A typical series inductor having about four complete turns each with a diameter of about 1.8 centimeters was found to provide a voltage of about 5 volts in the presence of arcing without adding any significant series impedance to the circuit. If desired, a clamp circuit 22 can be coupled in parallel with the inductor 20 to limit the maximum voltage that will appear across the inductor 20. A power supply 15 connected across the phase and neutral conductors 14, 18 upstream of the series inductor provides the low voltage power required to operate the various components of the circuit. Arc detector circuit 24 powered by power supply 15 is connected to receive the di/dt potential from series inductor 20. More specifically, arc detector circuit 24 is coupled to receive the di/dt signal of the current in the neutral conductor 18 from inductor 20 and analyze it to determine if arcing is present. Upon determining that arcing is occurring, a trip signal is generated by an appropriate control circuit within arc detector circuit 24 and applied via conductor 26 to circuit interrupter 28. Accordingly, when arc detector circuit 24 detects the occurrence of an arc based upon the signal produced by series connected current sensing inductor 20, a trip signal is applied to circuit interrupter 28, which disconnects power to the load.

In addition, the trip signal can be fed to annunciation apparatus such as an LED, a light emitting means such as a lamp, an audio means such as a horn or siren, a graphical or alphanumeric display, etc. to indicate the occurrence of an arc.

Referring to FIG. 4, there is shown a circuit which is similar to that of FIG. 3 with the addition of a second inductor connected in series with the phase conductor and a clamp connected in parallel with the inductor to limit the maximum voltage across the inductor. An inductor 30, which may be of the same or different gauge wire as that of inductor 20, is connected in series with phase conductor 14. Series connected inductor 30 can be formed from a wire having as little inductance as would occur from a bend of 15 degrees to as much inductance as would occur from six or more turns of 360 degrees each, and having an air or magnetic core. When the series inductor is comprised of a conductor having a bend of 15 degrees, or a portion of a full turn, the diameter of the bend or portion of the turn can be, more or less, about three-quarters to one and a half Cm. The actual inductance that inductor 30 (and inductor 20) has is determined, mainly, by the magnitude of the output potential needed to operate the arc detector circuit 24, while, at the same time, minimizing the impedance that is added to the conductor. Inductor 30 is positioned to be in close proximity to inductor 20 and inductively coupled, either through air or magnetically, to inductor 20. An inductive coupling of about 20 percent between the inductors 20, 30 was found to provide good results. However, an inductive coupling from 5 percent to as close to 100 percent as is possible can be used.

Figure 6:
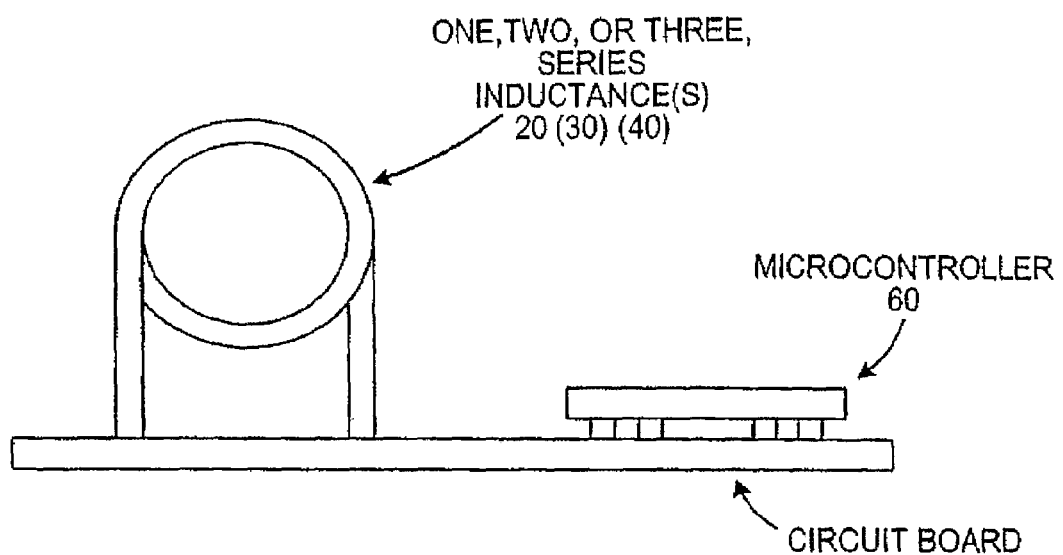
FIG. 6 is a side view of the series inductor(s) and microcontroller positioned orthogonal to each other on a circuit board.
Figure 7:
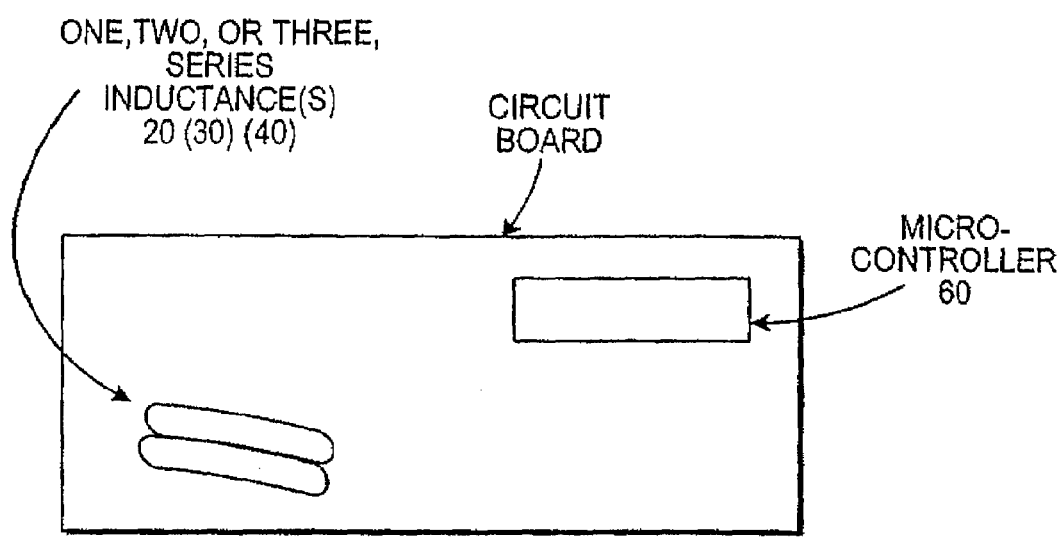
FIG. 7 is a top view of the series inductor(s) and microcontroller positioned orthogonal to each other on a circuit board.

In the embodiment of FIG. 4, inductor 30 is similar to inductor 20 and inductor 20 is inductively coupled to inductor 30. The inductive coupling between the two inductors is about 20 percent. The signal in inductor 30 which is inductively coupled into inductor 20 is fed to arc detector circuit 24. Other than inductor 30 and clamp 32 located on conductor 14, the circuit of FIG. 4 is similar to the circuit of FIG. 3. However, in the embodiment here disclosed, about 20 percent of the signal generated by inductor 30 is inductively coupled into inductor 20 and then fed to arc detection circuit 24. In those instances where a larger signal is required, inductor 30 can have an inductance that is larger than that of inductor 20, the inductive coupling between the inductors can be increased, or a second arc detector circuit similar to 24 can be coupled to phase conductor 14. A clamp circuit 32 can be coupled in parallel with inductor 30 to limit the maximum voltage across the inductor 30. Coupling between the inductors 20, 30 can be achieved through air or by magnetic material such as a magnetic core or a magnetic circuit. With either of these techniques, inductive coupling between the two inductors can be enhanced or reduced and, if desired, the overall inductance can be increased or decreased. In addition, to minimize undesired coupling effects between the inductors, the microcontroller and the circuit board electronics, the inductors, the microcontroller and circuit board can be positioned orthogonally, as shown in FIGS. 6 (side view) and 7 (top view).

As noted above, the derivative (di/dt) signal of the current in the neutral conductor generated by the series inductor 20 is fed to arc detector circuit 24 via conductor 34, and the derivative (di/dt) signal of the current in the phase conductor generated by the series inductor 30 is inductively coupled into inductor 20 from which it is then fed to arc detector circuit 24 via conductor 34. Thus, arc detector circuit 24 receives signals from inductor 20 and inductor 30 and, therefore, monitors the current in both the neutral and the phase conductors. For purposes of alternate channel sensitivity, the inductances of the two inductors 20, 30 can be coupled to be either inductively additive or canceling.

Also, the inductors 20, 30 can have inductances that are of equal or different values. Thus, depending of the requirements of the circuit, the inductance of inductor 20 can be less than, equal to or greater than the inductance of inductor 30.

In another embodiment of the invention the series inductor 20 of FIG. 3 is in the phase conductor 14 and ground is used as the return current path. In still another embodiment the series inductor is at least one winding of a transformer.

Figure 5:
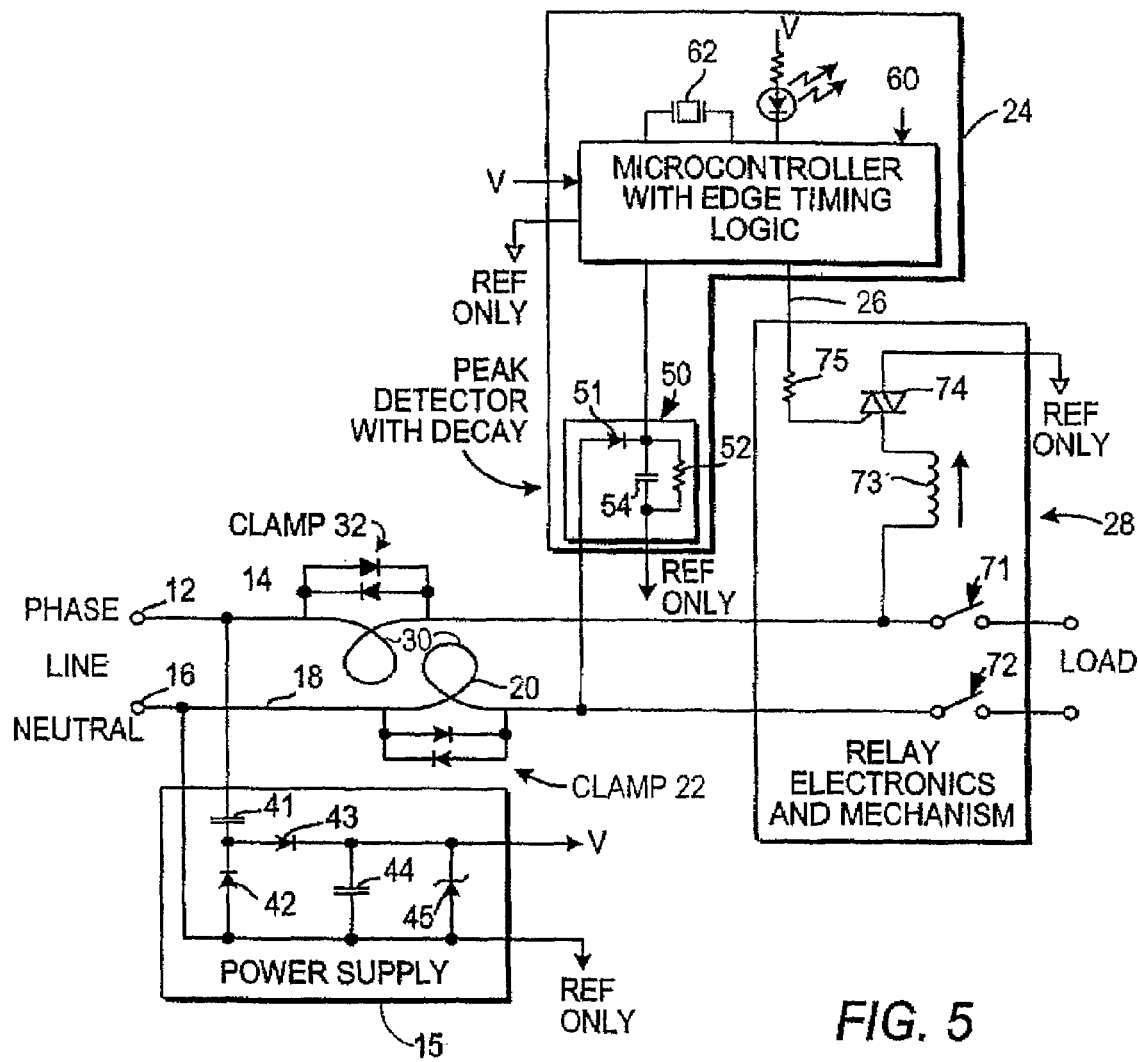
FIG. 5 is a circuit diagram of an arc detection circuit of the invention.

Referring to FIG. 5, there is shown a circuit diagram of the embodiment shown in FIG. 4. Inductor 20 is connected in series with conductor 18 and inductor 30 is connected in series with conductor 14. Power supply 15 which receives power from the phase 14 and neutral 18 conductors supplies the required potential to the arc detector circuit 24. The power supply shown has a capacitor 41 connected in series with a diode 42, and this series network is connected across the phase 14 and neutral 18 conductors upstream of the series connected inductors 20, 30. The junction of capacitor 41 and diode 42 is connected through diode 43 to an output terminal provided to supply the required potential to the arc detector circuit 24. Connected between the output terminal of the power supply and the neutral terminal is a capacitor 44 in parallel with a Zener diode 45.

The arc detector circuit 24 includes a peak detector with decay 50 and a microcontroller with edge timing logic 60. The Peak detector includes a diode 51 connected between an input terminal of the microcontroller with edge timing logic 60 and the neutral conductor 18 at a point downstream of the inductors 20 and 30. A parallel circuit of a resistor 52 and a capacitor 54 is connected between the cathode terminal of diode 51 and a neutral terminal. The diode 51 of the peak detector provides a charging path for capacitor 54. The peak detector with decay provides signals that are representative of the derivative (di/dt) of the current in conductor 18 and conductor 14 and also serves to stretch any high speed pulses detected by the series connected inductors.

The microcontroller with edge timing logic 60 may be of the type disclosed in U.S. Pat. No. 5,223,795, the entire disclosure of which is incorporated herein in its entirety by reference. Microcontroller with edge logic 60 produces a trip signal when a signal which represents an arc is received from the peak detector 50. More specifically, microcontroller 60 analyzes the signal received from the peak detector to determine if arcing is present and, upon finding that arcing is present, generates a trip signal which is fed to circuit interrupter 28. Crystal 62 provides timing for the operation of the microprocessor.

The trip signal generated by the microcontroller is fed via conductor 65 to the gate terminal of a triac 74 in circuit interrupter 28. Circuit interrupter 28 includes a relay having two separate sets of contacts 71, 72 and a coil 73. Contacts 71 are series connected with phase conductor 14 and contacts 72 are series connected with the neutral conductor. The coil 73 of the relay is connected in series with the triac and this series network is connected between the phase conductor 14 and a neutral terminal. The gate terminal of the triac is connected through resistor 75 to conductor 65 to receive the trip signals from the microcontroller 60. A trip signal from the microcontroller primes the triac to conduct which allows current to flow through the relay coil and open the contacts 71, 72.

Referring to FIG. 8, there is shown an arc fault detector in accordance with the principles of this invention in combination with a Ground Fault Circuit Interrupter (GFCI). The circuit 182, commonly referred to as Arc Fault Circuit Interrupter/Ground Fault Circuit Interrupter (AFCI/GFCI) comprises two current transformers having magnetic cores 233, 234 and coils 235, 236, respectively, coupled to integrated circuit (IC) 225 which may comprise the LM1851 manufactured by National Semiconductor or the RA9031 manufactured by Raytheon. AC power from the phase 14 and neutral 18 conductors is input to power supply circuit 15 which generates power for the internal circuitry of the AFCI/GFCI device.

The series circuit of relay coil 218 and SCR 224 is connected between power supply 36 and a neutral terminal, and the gate terminal of the SCR is coupled to the output terminal of SCR trigger circuit 236. The output of pin 1 of IC 225 is the input to the SCR trigger circuit 236.

A diode 245 is coupled in parallel with coil 235 which is coupled to pins 2 and 3 via resistor 247 and capacitors 239, 249. Pin 3 is also coupled to neutral via capacitor 251. Coil 236 is coupled to pins 4 and 5 of IC 225 via capacitors 237, 238, and pin 4 is also coupled to neutral. Pin 6 of IC 225 is coupled to pin 8 via sensitivity resistor 241 and pin 7 is coupled to neutral via time delay capacitor 243. Pin 8 is also coupled to capacitor 222 and to resistor 221 and is connected to power supply 15.

Line side electrical conductors, phase conductor 14 and neutral conductor 18, pass through the transformers 233, 234 to the load side phase and neutral conductors. Relay coil 218 is coupled to operate contacts 231, 232, associated with the phase and neutral conductors, respectively, which function to open the circuit in the event a fault is detected. The coil 218 of the relay is energized when the SCR 224 is turned on by a signal from the trigger circuit 236. In addition, the circuit comprises a test circuit comprised of momentary push button switch 228 in series with resistor 230. When switch 228 is pressed, a temporary simulated ground fault from load phase to line neutral is created to test the operation of the device.

Inductors 20, 30 are coupled in series with conductors 14, 18 and downstream of the input to the power supply 36. The two inductors are inductively coupled to each other and inductor 20 is connected to feed a signal representative of the derivative (di/dt) current in the conductors to the arc fault detector 24 as described above. The microcontroller of the arc fault detector can be a stand alone component or it can be a part of the IC 225 of the ground fault circuit interrupter. If the microcontroller is a stand alone component, the trip signal generated by the microcontroller is fed to the SCR trigger circuit 236. If the microcontroller is a part of IC 225, the trip signal is the TRIG-GFCI signal from IC 225.

In the description of the embodiments of the invention here disclosed, either one or both of the series inductors 20, 30 can be primary windings inductively coupled either through air or a magnetic core to a common secondary winding or separate secondary windings connected to feed received signals to the microcontroller. Thus, the series inductors provide the derivative (di/dt) of current flow and are the primary of at least one current transformer. An inductor of the invention here disclosed can be formed from a conductor having as little inductance as would occur from a bend of 15 degrees to as much inductance as would occur from six or more turns of 360 degrees each, and having an air or magnetic core. The series inductance is connected in series with all or part of the current flowing in the conductor, where the individual or combined inductances of the windings are used to obtain direct measurement of the derivative of current flowing in the conductor(s).

The two series inductors 20, 30 can have an inductance of between 0.1 and 1,000,000 nanohenrys. Inductors having an inductance of between 0.1 and 100 nanohenrys were made by putting a loop having a turn of less than 45 degrees in a 12 gauge wire. A loop having a turn of approximately 45 degrees in the conductor produced an inductance of approximately one nanohenry and, a loop of about four turns of 360 degrees each having a diameter of about 1 Cm. formed an inductor having an inductance of approximately 1,000,000 nanohenrys.

There is here disclosed a method and apparatus for detecting the occurrence of arcing of a conductor. Improved resolution, signal to noise ratio, derivative accuracy and high frequency response is obtained from a direct measurement of the derivative of current flow. In the invention, the inductor is connected in series with the line current to measure the derivative di/dt of the current flow. Low noise measurement is achieved by referencing the electronics to one side of the inductor, and having the electronics monitor the voltage on the other side of the inductor.

Line current surges generate magnetic flux through the series inductor which, in turn, can induce a magnetic flux in the surrounding electronic material. Surface and sheet currents can also be induced in the surrounding material, in response to the magnetic flux. By orienting the inductor to be orthogonal to the printed circuit board having the electronics of the arc fault detector, the surface and sheet currents on the circuit board itself, and in the electronics mounted on or coplaner with the circuit board can be minimized.

If the derivative di/dt of the current becomes very high in magnitude, there may be an undesirable large drop of line voltage across the inductor. This can be avoided by clamping the maximum voltage drop across the inductor with one of more diodes, Zener diodes, avalanche diodes, diacs, mov's, sidacs, transorbs, gas tubes, etc.

In those instances where sensitivity to the derivative of current flow on both the phase and neutral power lines is desired, a second inductor can be located in close proximity and orientation to the first inductor such that flux coupling is achieved between the two inductors. Coupling can also be achieved, enhanced or reduced by using magnetic material either in a core or a magnetic circuit, either of which will effectively modify the overall inductance. Thus, there is also disclosed a second inductor flux coupled to the first inductor for alternate channel sensitivity where the two inductors can be either additive or canceling and can be of different magnitudes.

In those instances where the electrical power distribution network is three phase, a third series inductor can be coupled in series with the third conductor to produce a voltage across itself related to the derivative of current flow in the third conductor and positioned to achieve flux coupling with the inductor in the first and/or second series inductor(s).

In devices that employ current measurements, space, which is usually at a premium in many device designs, can be saved by combining the series inductor that is sensitive to the derivative of current flow with the primary of a current measuring transformer. In this manner, the same inductor which provides direct measurement of the derivative of the current flow can also function as the primary of the current transformer.

Where alternate channel sensitivity and current measurement are both required, the two inductors can act as the primaries of a current transformer. In this embodiment, the flux induced in the transformer core from each of the two inductors should be either additive or subtractive but, when subtractive, they should not fully cancel each other.

Where alternate channel sensitivity and ground fault detection are both required, the two inductors can together act as the primaries on a ground fault differential transformer. In this embodiment, the coupling provided by the transformer may or may not be the only coupling between the two inductors and the flux induced in the transformer core for a given current, from each of the inductors, must either fully of nearly fully cancel.

Where alternate channel sensitivity and ground fault detection are both required, the two inductors can together act as the primaries on a ground fault transformer. In this embodiment, the coupling provided by the transformer may or may not be the only coupling between the two inductors. Therefore, the flux induced in the transformer core for a given current, from each of the inductors, should be additive or subtractive.

The arc detector here disclosed can be combined with other types of circuit interrupting devices such a GFCI, IDCI or ALCI to create a multipurpose device. In the case of a GFCI, the arc detection circuitry can be placed onboard the same silicon chip typically used in today's GFCI devices. In some instances, some of the pins of commonly used GFCI integrated circuits can be converted for multifunction operation. The AFCI can be powered from the same power supply that provides power to the circuit interrupting device. This combined approach can result in reduced manufacturing costs as the mechanical parts of the circuit interrupting device such as the trip relay and the mechanical contact closure mechanisms will serve dual purposes. In addition, adding AFCI circuitry to an existing circuit interrupting device is a logical enhancement of such present day devices. In particular, it is logical to enhance a GFCI with AFCI circuitry since a GFCI can detect arcing in certain situations including any condition whereby an arc produces leakage current to ground.

The foregoing has outlined, rather broadly, the preferred feature of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention and that such other structures do not depart from the spirit and scope of the invention is its broadest form.

What is claimed is:

1. Apparatus for detecting arcs on an electrical power distribution network having at least one conductor comprising:
    a series inductance circuit adapted to be coupled in series with a conductor of the network wherein a voltage is produced across the series inductance circuit having a waveform which relates to the derivative of current flow in the conductor; and
    an arc detection circuit coupled to identify when the waveform of the voltage across the series inductance circuit is representative of arcing on the network and to generate an arc detection signal when the waveform is representative of arcing on the network.

2. The apparatus of claim 1 wherein the at least one conductor comprises a neutral conductor and a phase conductor.

3. The apparatus of claim 1 wherein the at least one conductor comprises a neutral conductor and two phase conductors.

4. The apparatus of claim 1 wherein the at least one conductor comprises a neutral conductor and three phase conductors.

5. The apparatus of claim 1 wherein the at least one conductor comprises two phase conductors.

6. The apparatus of claim 1 wherein the at least one conductor comprises a single conductor with return current carried through a ground or frame.

7. The apparatus of claim 1 wherein the series inductance circuit is adapted to be coupled to be in series with all current in the at least one conductor.

8. The apparatus of claim 1 wherein the series inductance circuit is adapted to be coupled in series with part of the current in the at least one conductor.

9. The apparatus of claim 1 wherein the series inductance circuit is an inductor.

10. The apparatus of claim 1 wherein the series inductance circuit is at least one winding of a transformer.

11. The apparatus of claim 10 wherein the transformer is coupled to a current measuring circuit to measure current in at least one conductor of the network.

12. The apparatus of claim 10 wherein the transformer forms part of a ground fault circuit to measure ground fault grounded neutral current flow in at least one conductor of the network.

13. The apparatus of claim 1, further comprising at least one current measuring circuit coupled to said series inductor circuit to measure current flowing in said at least one conductor from the waveform of the voltage across said series inductor circuit.

14. The apparatus of claim 13, wherein said ground fault detection circuit comprises at least one integrated circuit.

15. The apparatus as in claim 13, wherein said trip circuit is configured to be in communication with said ground fault detection circuit and with said arc fault detection circuit, and wherein said trip circuit comprises a silicon controlled rectifier (SCR).

16. The apparatus of claim 1 wherein the series inductance circuit has an inductance of between 0.1 and 1,000,000 nanohenries.

17. The apparatus of claim 1 wherein the series inductance circuit comprises a conductor having a bend between 15 degrees and a turn of 360 degrees.

18. The apparatus of claim 1 wherein the series inductance circuit comprises a conductor having between one and six turns.

19. The apparatus of claim 1 further comprising clamping circuit coupled in parallel with the series inductance circuit.

20. The apparatus of claim 19 wherein the clamping circuit comprises at least one diode.

21. The apparatus of claim 19 wherein the at least one diode comprises a first diode coupled in parallel with a second diode head-to-toe.

22. The apparatus of claim 19 wherein the clamping circuit comprises at least one Zener diode.

23. The apparatus of claim 22 wherein the clamping circuit comprises at least one diode.

24. The apparatus of claim 22 wherein the at least one diode comprises a first diode coupled in parallel with a second diode head-to-toe.

25. The apparatus of claim 22 wherein the clamping circuit comprises at least one Zener diode.

26. The apparatus of claim 22 wherein the at least one diode comprises first and second Zener diodes coupled in parallel head-to-toe.

27. The apparatus of claim 22 wherein the at least one diode comprises first and second Zener diodes coupled back-to-back.

28. The apparatus of claim 22 wherein the clamping circuit comprises an avalanche diode.

29. The apparatus of claim 22 wherein the clamping circuit comprises a diac.

30. The apparatus of claim 22 wherein the clamping circuit comprises an MOV.

31. The apparatus of claim 22 wherein the clamping circuit comprises a sidac.

32. The apparatus of claim 22 wherein the clamping circuit comprises a transorb.

33. The apparatus of claim 22 wherein the clamping circuit comprises a gas tube.

34. The apparatus of claim 1 further comprising: a trip circuit coupled to the arc detection signal from the arc detection circuit to interrupt current flow in at least one conductor of the electrical power distribution network.

35. The apparatus of claim 34, wherein said annunciating circuit is at least one LED.

36. The apparatus of claim 34 wherein said annunciating circuit is at least one lamp.

37. The apparatus of claim 34 wherein said annunciating circuit is at least one audio generating circuit.

38. The apparatus of claim 34 wherein said annunciating circuit is a graphical or alphanumeric display.

39. The apparatus of claim 1 further comprising:
an annunciating circuit coupled to the arc detection circuit to indicate the status of the arc detection signal.

40. The apparatus as in claim 1, wherein said series inductance circuit is a first series inductance circuit and wherein the apparatus further comprises:
a second series inductance circuit adapted to be coupled to at least one conductor to generate magnetic flux related to the derivative of current flow in the at least one conductor;
a flux coupling circuit to link the magnetic flux of the second series inductance to the first series inductance circuit.

41. The apparatus of claim 40, further comprising: a third series inductance circuit coupled to at least one conductor of the network to generate magnetic flux related to the derivative of current flow in the at least one conductor and coupled to link the magnetic flux of the third series inductances to the first series inductance through the flux coupling circuit.

42. The apparatus of claim 40, wherein the flux coupling circuit is a magnetic core.

43. The apparatus of claim 40, wherein the flux coupling circuit is an air core.

44. The apparatus of claim 40, further comprising:
a ground fault current measuring circuit to measure the ground fault current in said at least one of conductor of the network; and
a ground fault current detection circuit responsive to the ground fault current measuring circuit to generate a ground fault detection signal when a ground fault is present.

45. The apparatus of claim 44, further comprising: a trip circuit responsive to the arc detection signal and the ground fault detection signal to interrupt current flow in at least one conductor of the electrical power distribution network.

46. The apparatus of claim 44 further comprising: annunciating circuit coupled to the arc detection circuit and the ground fault current detection circuit to indicate the status of the arc detection signal and/or ground fault detection signal.

47. The apparatus as in claim 1, further comprising a circuit board, and a microcontroller, wherein said series inductance circuit is coupled to said circuit board and said microcontroller is coupled to said circuit board.

48. The apparatus as in claim 1, wherein said series inductance circuit is a first series inductance circuit and wherein the device further comprises:
a second series inductance circuit adapted to be coupled to at least one conductor to generate magnetic flux related to the derivative of current flow in the at least one conductor;
a current measuring circuit coupled to at least one of said first and second series inductance circuits to measure the current flowing in at least one conductor from said waveform of the voltage across said at least one series inductance circuit.

* * * * *